United States Patent [19]

Clarke

[11] 4,378,502

[45] Mar. 29, 1983

[54] PROGRAMMABLE CONTROLLER INTERFACE APPARATUS

[75] Inventor: Geoffrey Clarke, Blunsdon, near Swindon, England

[73] Assignee: Square D Company, Palatine, Ill.

[21] Appl. No.: 265,987

[22] PCT Filed: Aug. 8, 1979

[86] PCT No.: PCT/GB79/00134

§ 371 Date: Apr. 10, 1980

§ 102(e) Date: Apr. 10, 1980

[87] PCT Pub. No.: WO80/00395

PCT Pub. Date: Mar. 6, 1980

[30] Foreign Application Priority Data

Aug. 10, 1978 [GB] United Kingdom ............... 32891/78

[51] Int. Cl.$^3$ ........................... H05K 1/18; H02J 1/16

[52] U.S. Cl. ..................................... 307/75; 361/397

[58] Field of Search .................... 307/75, 42; 361/397, 361/400, 401, 415, 416

[56] References Cited

FOREIGN PATENT DOCUMENTS 2236399 1/1975 France .

Primary Examiner—Donald A. Griffin
Attorney, Agent, or Firm—James W. Potthast; Richard T. Guttman

[57] ABSTRACT

An interfacing apparatus for a programmable controller having input modules of limited input compatibility and an input signal adjusting circuit for adjusting the input signals to make them compatible with the input modules.

12 Claims, 2 Drawing Figures

PROGRAMMABLE CONTROLLER INTERFACE APPARATUS

BACKGROUND OF THE INVENTION

This invention relates to an apparatus for interfacing input signals of a system with a processor of a programmable controller controlling said system.

In programmable controllers the processor receives input data from the system being controlled via a plurality of input modules arranged on an input rack assembly. The modules are adapted to receive input data from the system indicating the status of the various elements of the system and produce from this data logic signals which are then passed to the processor. The modules also serve to indicate the status of the associated element and to suppress noise.

The input status signals from the system, i.e. inputs from push buttons, limit switches, selector switches, pressure switches, etc., may be of different amplitudes and may be either d.c. or a.c. In such cases it is necessary to identify the characteristics of the signal in a particular channel and provide a compatible input module which is capable of receiving a signal of that characteristic to produce therefrom the required logic signal.

Because of this circumstance, it has been necessary to provide a plurality of different input modules capable of handling the plurality of different input status signal characteristic found in a given system.

SUMMARY OF THE INVENTION

It is therefore a principal object of the present invention to provide an apparatus for interfacing input signals of a system having a plurality of diverse sources of input signals which is manually adjustible to receive and compatibly function with input signals having a range of characteristics. This eliminates the need to maintain or produce diverse input modules each of which is compatible with only one type of status input signal source. Instead, only the interfacing apparatus of the present invention needs to be inventoried and then manually adjusted on site as need arises for compatibility with input status signals of different characteristics.

In the preferred embodiment of the present invention, there is provided a circuit board for an input rack assembly of a programmable controller of the type employing input modules. The board includes a plurality of input terminals for receiving status input signals from the system being controlled and a plurality of socket stations for receiving plug-in input modules. Each socket is connected to selected input terminals through an associated signal adjusting circuit. In the preferred embodiment, the signal adjusting circuits include selectably adjustable filters and selectably adjustable potentiometers. By means of manual adjustment the status input signals passed to the individual sockets are adjusted for the desired characteristics.

BRIEF DESCRIPTION OF THE DRAWINGS

The foregoing objects, features and advantages will be described in greater detail and the further objects, features and advantages will be made apparent from the following detailed description of a preferred embodiment of the present invention which is given with reference to the drawings, in which.

DETAILED DESCRIPTION

Figure 1:
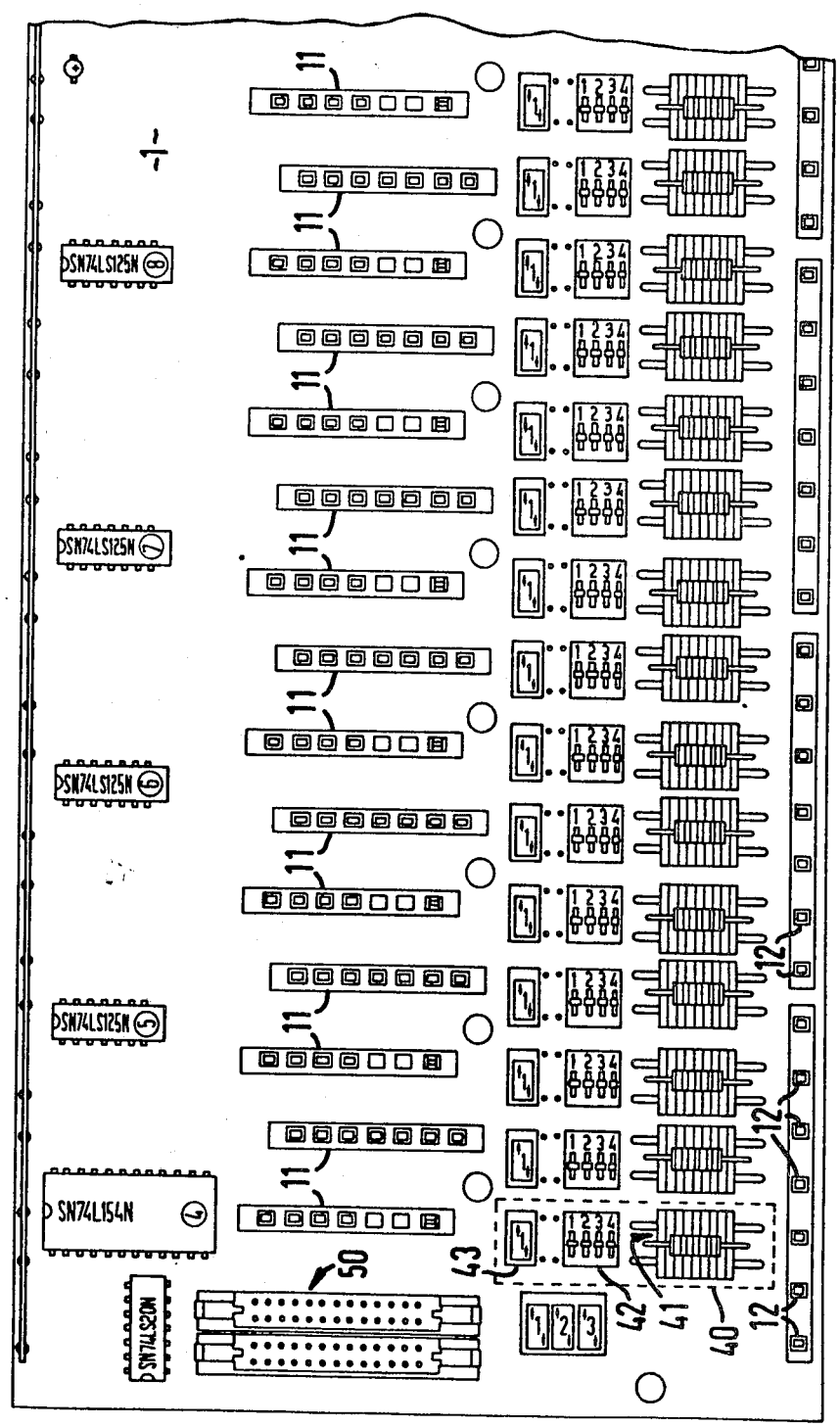
FIG. 1 is a plan view of the preferred embodiment of a circuit board for an input rack assembly according to the present invention.

Referring to FIG. 1, the interfacing apparatus is seen to include a circuit board for an input rack assembly for a programmable controller with a base 1 to which are mounted a plurality of pairs of socket mouldings 11. Each pair of socket mouldings 11 forms a socket adapted to receive plug-in input modules of the type, for example, described in U.K. Pat. Specification No. 1,453,195, now British Pat. No. 1,453,195. Each socket 11 is provided with terminals which connect with pins of the plug-in input module. Socket output terminals connect the plug-in input module to addressing integrated circuits 3 to 8 and serve to feed logic signals from the module to the processor. Alternatively, the sockets and plug-in input modules are replaced by input modules which are permanently connected with their associated circuitry.

The circuit board is provided with input terminals 12 for receiving status input signals from the system being controlled. To ensure reliable operation of the elements of the system, the status input signals are generally of a particular level depending on the element, and the input signals may vary from a low level d.c. signal to a relatively high level a.c. signal. Since the circuit board of this invention has been designed for use with one type of input plug-in module, it is necessary to ensure that the input status signal which is passed to the input module is of a level and of a type which the module can handle to produce from this input status signal the necessary logic output for the processor.

To this end the input status signals are passed from the input terminals 12 to the socket input terminals through signal adjusting circuits 40.

Each signal adjusting circuit or, in this instance, voltage controlling circuit 40 includes a selectably adjustable potentiometer made up of a group of resistors 41 and selector switch 42. The adjustable potentiometer allows the input signal to be brought to a level which can be handled by the input module. Each voltage controlling circuit 40 also includes an adjustable filter 43. The filter 43 is suitably a switched RC filter with a maximum time constant of about 15 ms. When the module is used with an a.c. input, the filter 43 can be used to filter noise from the rectified input. With a d.c. input, the filter can be used to introduce a desired delay to input signals.

The output of the voltage controlling circuits 40 are passed to respective socket input terminals 11 which contact the input pins of the plug-in in-put modules.

Figure 2:
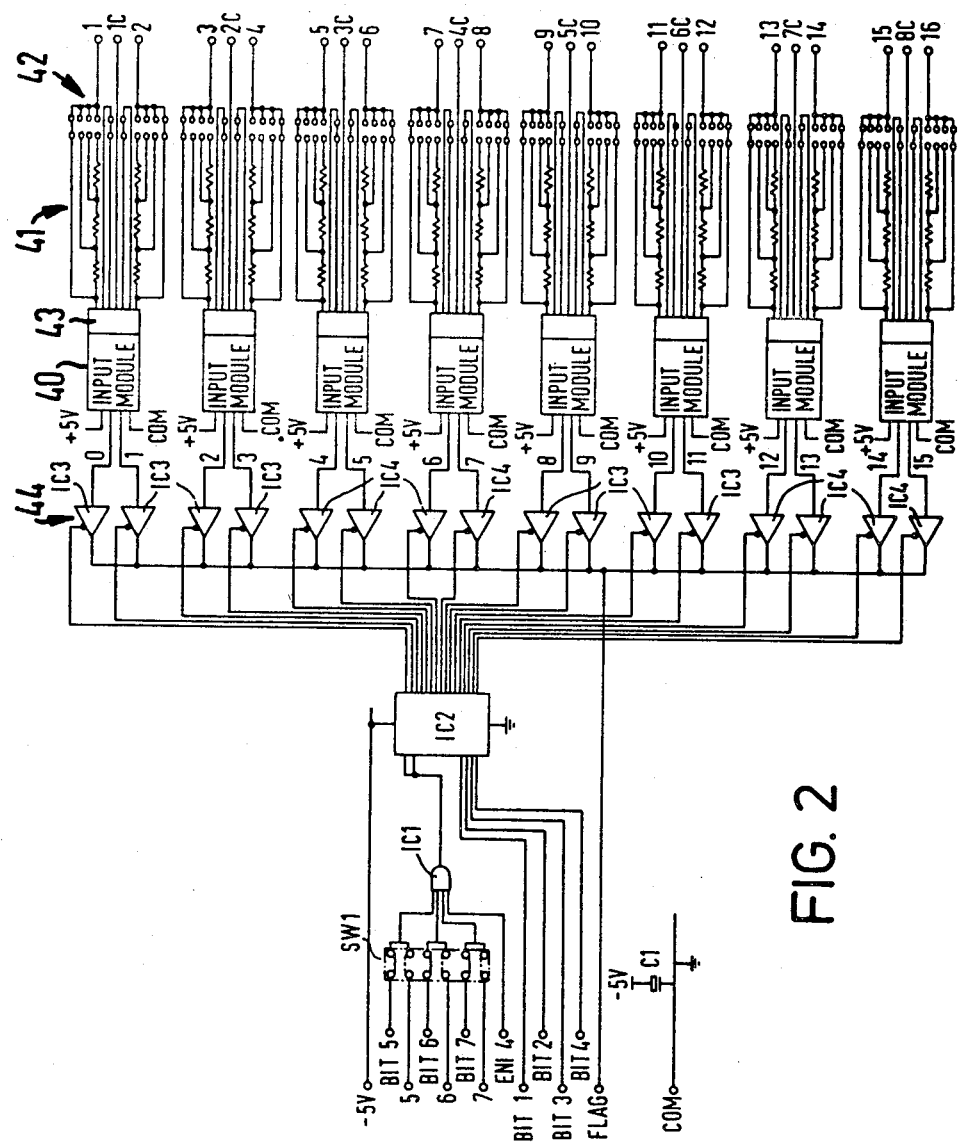
FIG. 2 is an electrical circuit diagram of the circuit board of FIG. 1.

Referring to FIG. 2, eight channels of the circuit board are shown. The gates 44 are formed by integrated circuits 5 through 8 of FIG. 1, while IC1 and IC2 of FIG. 2 correspond to the items 3 and 4 respectively of FIG. 1.

The logic output signals from the socket output terminals are passed to a connector plug 50 which may be of the type to receive the I/O data cable terminal described in our co-pending U.K. Application No. 32889/78.

The physical dimensions of the circuit board are such to allow the board to be used with the rack assembly of our co-pending Application No. 32892/78.

Thus, the circuit board of this invention allows a single input module to be used even when the input status signals from the system being controlled are of widely differing voltage levels and response times and other characteristics. This obviates the need for a user to have at his disposal a number of different input modules which would cover the range of voltages received from the system.

I claim:

1. A circuit board for an input rack assembly of a programmable controller, the board including a plurality of input terminals for receiving status input signals from the system being controlled, and a plurality of socket stations for receiving plug-in input modules, each socket station being connected to associated ones of the input terminals through a respective voltage controlling circuit, each voltage controlling circuit including selectably adjustable filter means and selectably adjustable potentiometer means, whereby status input signals passed to individual socket stations may be of desired voltage types and voltage levels.

2. The circuit board of claim 1, in which each potentiometer means comprises a plurality of fixed resistors and swtich means to connect selected ones of the resistors in circuit.

3. An apparatus for interfacing input signals of a system having a plurality of sources of diverse input signals with a processor of a programmable controller controlling said system, comprising:
a plurality of input terminals for connection with said diverse input signal sources;
a plurality of connectors for connection of a plurality of input modules with said processor; and
a plurality of signal adjusting circuits connected between said plurality of input terminals and said plurality of input modules connectors to produce adjusted input signals compatible with said input modules in response to said system input signals, said signal adjusting circuits including manually adjustable means for adjusting the input signals.

4. The apparatus of claim 3 in combination with a plurality of input modules connected with said plurality of connectors.

5. The apparatus of claim 4 in which said plurality of input modules are substantially alike with respect to the input signals which they are compatible with.

6. The apparatus of claim 3 in which said connectors are releasible connectors.

7. The apparatus of claim 6 in said releasible connectors are socket stations for receipt of plug-in input modules.

8. The apparatus of claim 3 in which said manually adjustable means includes a potentiometer.

9. The apparatus of claim 3 or 8 in which said adjustable means includes a manually adjustable filter.

10. The apparatus of claim 3 in which said adjustable means includes a switch.

11. The apparatus of claim 10 in which said adjustable means includes a plurality of resistors, and means including said switch for connecting selected ones of said resistors in circuit.

12. The apparatus of claim 3 in which said signal adjusting circuits includes means for producing an altered input signal which is delayed with respect to its associated system input signal.

* * * * *